(12) United States Patent
Cheong

(10) Patent No.: US 10,236,398 B2
(45) Date of Patent: Mar. 19, 2019

(54) METHOD FOR MANUFACTURING TRANSPARENT ELECTRODE

(71) Applicant: ELECTRONICS AND TELECOMMUNICATIONS RESEARCH INSTITUTE, Daejeon (KR)

(72) Inventor: Woo-Seok Cheong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 377 days.

(21) Appl. No.: 15/093,379

(22) Filed: Apr. 7, 2016

(65) Prior Publication Data

US 2017/0012147 A1   Jan. 12, 2017

(30) Foreign Application Priority Data

Jul. 6, 2015  (KR) .................. 10-2015-0096099
Dec. 8, 2015  (KR) .................. 10-2015-0174338

(51) Int. Cl.
*H01L 31/0224* (2006.01)
*H01L 51/56* (2006.01)
*G06F 3/041* (2006.01)

(52) U.S. Cl.
CPC ...... *H01L 31/022466* (2013.01); *G06F 3/041* (2013.01); *H01L 51/56* (2013.01); *G06F 2203/04103* (2013.01)

(58) Field of Classification Search
CPC .................. H01L 31/022466; H01L 51/56
See application file for complete search history.

(56) References Cited

U.S. PATENT DOCUMENTS

| 9,123,914 | B2* | 9/2015 | Lee .................. H01L 51/5275 |
| 9,491,866 | B2 | 11/2016 | Lee et al. |
| 2009/0146945 | A1 | 6/2009 | Cho |
| 2010/0156795 | A1 | 6/2010 | Kim et al. |
| 2010/0231542 | A1 | 9/2010 | Momose |
| 2012/0098790 | A1 | 4/2012 | Han |
| 2014/0144501 | A1 | 5/2014 | Jung et al. |
| 2015/0008401 | A1 | 1/2015 | Lee et al. |

FOREIGN PATENT DOCUMENTS

| JP | 2010-211647 A | 9/2010 |
| JP | 2010-211823 A | 9/2010 |
| JP | 2010-257492 A | 11/2010 |
| JP | 2013-532390 A | 8/2013 |
| JP | 2015-045922 A | 3/2015 |
| KR | 10-1998-0010543 A | 4/1998 |

(Continued)

*Primary Examiner* — Seahvosh Nikmanesh

(57) ABSTRACT

The present disclosure relates to a transparent electrode, and provides a method for manufacturing a transparent electrode, the method comprising forming a multi-layered transparent conductive film by sequentially laminating a first oxide layer, a metal layer, and a second oxide layer on a transparent substrate, forming a mask pattern on the second oxide layer, performing an etching process using the mask pattern as an etching mask to form, in the second oxide layer, a trench exposing the upper surface of the metal layer, and forming a metal pattern in the trench.

17 Claims, 10 Drawing Sheets

(56) References Cited

FOREIGN PATENT DOCUMENTS

| | | |
|---|---|---|
| KR | 10-2001-0042954 A | 5/2001 |
| KR | 10-2008-0010034 A | 1/2008 |
| KR | 10-2008-0054318 A | 6/2008 |
| KR | 10-2009-0059726 A | 6/2009 |
| KR | 10-2010-0051292 A | 5/2010 |
| KR | 10-2010-0065486 A | 6/2010 |
| KR | 10-2010-0073546 A | 7/2010 |
| KR | 10-2010-0082514 A | 7/2010 |
| KR | 10-2010-0095886 A | 9/2010 |
| KR | 10-2010-0131076 A | 12/2010 |
| KR | 10-2011-0000722 A | 1/2011 |
| KR | 10-2011-0000985 A | 1/2011 |
| KR | 10-2012-0080930 A | 7/2012 |
| KR | 10-2012-0081876 A | 7/2012 |
| KR | 10-1328483 B1 | 11/2013 |
| WO | WO 2008/072900 A1 | 6/2008 |

\* cited by examiner

| line width(μm) | pitch(μm) | thickness(μm) | T(%) | Rs(Ω/□) |
|---|---|---|---|---|
| 10 | 300 | 2.5 | 89 | 0.2068 |
| | | 5 | 89 | 0.1034 |
| | | 10 | 89 | 0.0517 |
| | 500 | 2.5 | 90 | 0.3448 |
| | | 5 | 90 | 0.1724 |
| | | 10 | 90 | 0.0862 |
| | 1000 | 2.5 | 91 | 0.6896 |
| | | 5 | 91 | 0.3448 |
| | | 10 | 91 | 0.1724 |
| 5 | 300 | 2.5 | 90.5 | 0.4136 |
| | | 5 | 90.5 | 0.2068 |
| | | 10 | 90.5 | 0.1034 |
| | 500 | 2.5 | 91 | 0.6896 |
| | | 5 | 91 | 0.3448 |
| | | 10 | 91 | 0.1724 |
| | 1000 | 2.5 | 91.5 | 1.3792 |
| | | 5 | 91.5 | 0.6896 |
| | | 10 | 91.5 | 0.3448 |

METHOD FOR MANUFACTURING TRANSPARENT ELECTRODE

CROSS-REFERENCE TO RELATED APPLICATIONS

This U.S. non-provisional patent application claims priority under 35 U.S.C. § 119 of Korean Patent Applications No. 10-2015-0096099, filed on Jul. 6, 2015 and No. 10-2015-0174338, filed on Dec. 8, 2015, the entire contents of which are hereby incorporated by reference.

BACKGROUND

The present disclosure herein relates to a method for manufacturing a transparent electrode, and particularly, to a method for manufacturing a transparent electrode having a mesh-structured metal pattern.

Recently, transparent electrodes have been used as electrodes in electronic devices such as solar cells and organic electro luminescence (EL) devices. Particularly, in the fields of a next-generation touch sensor, a transparent heater, and the like, a large-area transparent electrode having a high transmittance of about 90% and a low resistance of 10 Ω/☐ or less is required. A transparent conductive oxide (TCO) electrode, a hybrid transparent electrode having an oxide/metal/oxide (OMO) structure, or a metal electrode having a mesh structure is currently used as a transparent electrode in industries. The metal electrode having a mesh structure is obtained by forming a bulk metal in the shape of a network as seen from a plan view.

SUMMARY

An object of the present disclosure is to provide a method for manufacturing a transparent electrode including a mesh-structured metal electrode.

Another object of the present disclosure is to provide a method for manufacturing a transparent electrode having high transmittance and low resistance.

The object of the present disclosure is not limited to the above-mentioned objects, and other objects not mentioned herein will be clearly understood by those skilled in the art from the following description.

A method for manufacturing a transparent electrode according to embodiments of the inventive concept includes forming a multi-layered transparent conductive film by sequentially laminating a first oxide layer, a metal layer, and a second oxide layer on a transparent substrate, forming a mask pattern on the second oxide layer, performing an etching process using the mask pattern as an etching mask to form, in the second oxide layer, a trench exposing the upper surface of the metal layer, and forming a metal pattern in the trench.

In an embodiment, the metal pattern may have a mesh structure as seen from a plan view.

In an embodiment, the metal pattern may have, as seen from a plan view, a grid shape including first metal patterns which extend in one direction to form a plurality of rows, and second metal patterns which extend in the direction perpendicular to the one direction to form a plurality of columns.

In an embodiment, the metal pattern may have a honeycomb shape as seen from a plan view.

In an embodiment, the forming of the metal pattern may include performing a plating process using the exposed upper surface of the metal layer as a seed.

In an embodiment, the plating process may use at least any one selected from the group consisting of copper (Cu), nickel (Ni), silver (Ag), and an alloy thereof as a source material.

In an embodiment, the upper surface of the metal pattern may be formed so as to be higher than the upper surface of the second oxide layer and lower than the upper surface of the mask pattern.

In an embodiment, the mask pattern may have a height of 1 to 10 μm from one surface of the second oxide layer, and the metal pattern may have a height of 0.1 to 10 μm from one surface of the second oxide layer.

In an embodiment, the metal pattern may have a width of 1 to 20 μm.

In an embodiment, the metal layer may include any one selected from the group consisting of silver (Ag), aluminum (Al), molybdenum (Mo), gold (Au), palladium (Pd), titanium (Ti), copper (Cu), and an alloy thereof.

In an embodiment, the first oxide layer and the second oxide layer each may include any one selected from the group consisting of zinc oxide (ZnO), tin oxide ($SnO_2$), silicon oxide ($SiO_2$), titanium oxide ($TiO_2$), silicon nitride ($SiN_x$), ZITO ($ZnO+In_2O_3+SnO_2$), ZTO ($ZnO+SnO_2$), AZO (Al-doped ZnO), GZO (Ga-doped ZnO), ITO ($In_2O_3+SnO_2$), IZO ($In_2O_3+ZnO$), and a compound thereof.

In an embodiment, the multi-layered transparent conductive film may further include an adhesion layer, and the adhesion layer may be formed in at least any one of between the first oxide layer and the metal layer, and between the metal layer and the second oxide layer.

In an embodiment, the adhesion layer may include any one selected from the group consisting of aluminum (Al), titanium (Ti), chromium (Cr), aluminum nitride (AlN), titanium nitride (TiN), aluminum oxide ($Al_2O_3$), titanium oxide ($TiO_2$), chromium oxide ($Cr_2O_3$), and silicon oxide ($SiO_2$, $Si_3O_4$).

In an embodiment, the method may further include, after the forming of the metal pattern, forming an anti-oxidation film on the metal pattern.

In an embodiment, the anti-oxidation film may include nickel (Ni) or silver (Ag).

In an embodiment, the method may further include forming a protective layer so as to cover the second oxide layer and the meal pattern after removing the mask pattern.

In an embodiment, the protective layer may include silicon oxide ($SiO_2$).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
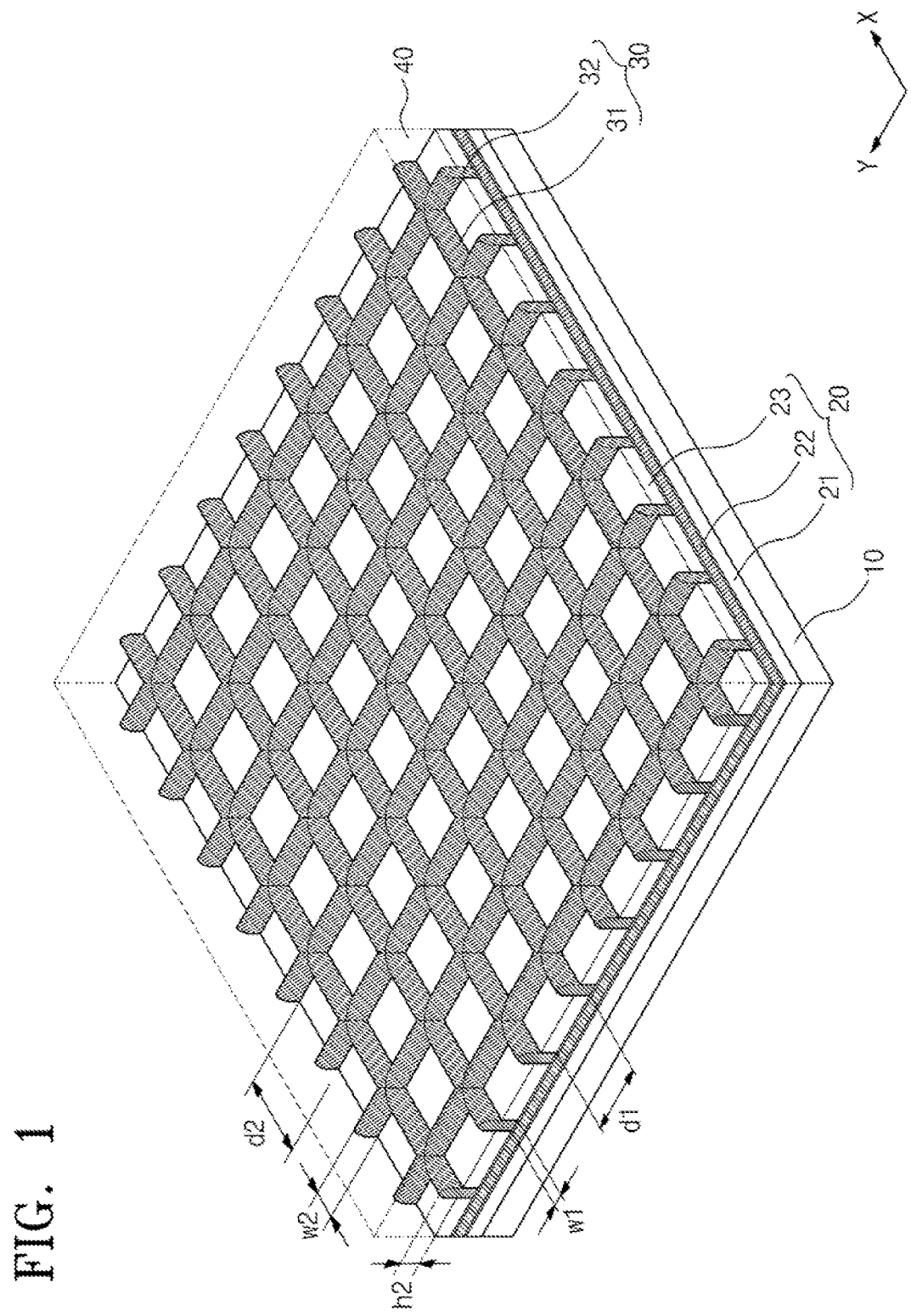
FIG. 1 is a perspective view illustrating an example of a transparent electrode manufactured according to embodiments of the inventive concept.

In order to fully understand the configuration and effect of the present invention, preferred embodiments of the inventive concept will be described with reference to the accompanying drawings. However, the present invention is not limited to the embodiments disclosed below, but may be implemented in various forms and subjected to various changes. Rather, the embodiments are provided so as to complete the present disclosure through description and fully convey the scope of the present invention to those skilled in the art. Those skilled in the art will understand that the inventive concept may be performed in a suitable environment. Like numbers refer to like elements throughout.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "comprises" and/or "comprising", when used in this specification, specify the presence of stated features, steps, operations, and/or elements, but do not preclude the presence or addition of one or more other features, steps, operations, elements, and/or groups thereof.

It will be understood that when a surface (or layer) is referred to as being "on", "connected to" or "coupled to" another surface (or layer), it can be directly on, connected or coupled to the other surface (or layer) or intervening surfaces (or layers) may be present.

It will be understood that, although the terms first, second, third, etc. may be used herein to describe various regions, surfaces (or layers), these regions, surfaces should not be limited by these terms. These terms are only used to distinguish one region or surface (or layer) from another region or surface (or layer). Thus, a first surface discussed in an embodiment could be termed a second surface in another embodiment. Each embodiment described and illustrated herein also includes complementary embodiments thereof.

The embodiments described herein will be explained with reference to sectional views and/or plan views as ideal exemplary views of the present invention. The dimensions of films or regions are exaggerated for effective description of the technical contents. Accordingly, the exemplary views may be modified according to manufacturing techniques and/or allowable errors. Therefore, the embodiments of the inventive concept are not limited to the specific features illustrated in the exemplary views, but may include other features that may be created according to manufacturing processes. For example, an etched region illustrated as a rectangle may have a rounded or curved feature. Therefore, regions illustrated in the drawings have general properties, and the shapes thereof are intended to illustrate a specific form of region in a device not for the purpose of limiting the scope of the invention.

Unless otherwise defined, all terms (including technical and scientific terms) used herein have the same meaning as commonly understood by those skilled in the art.

Hereinafter, the present invention will be described in detail by way of describing preferred embodiments of the inventive concept with reference to the accompanying drawings.

Figure 2:
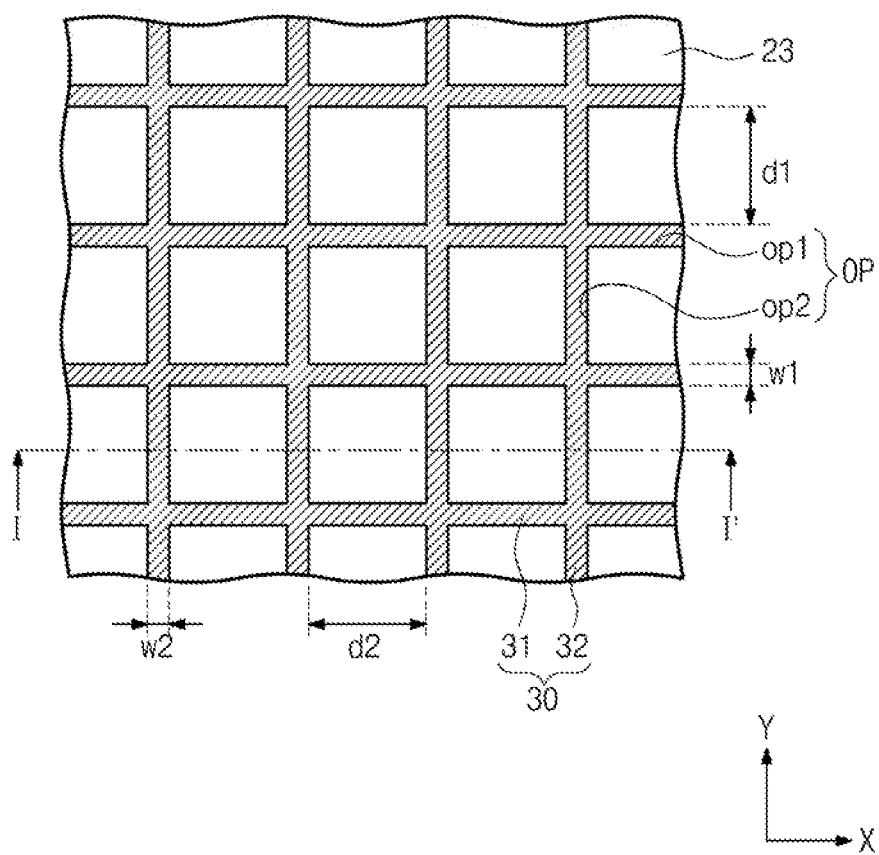
FIG. 2 is a plan view of FIG. 1.
Figure 3:
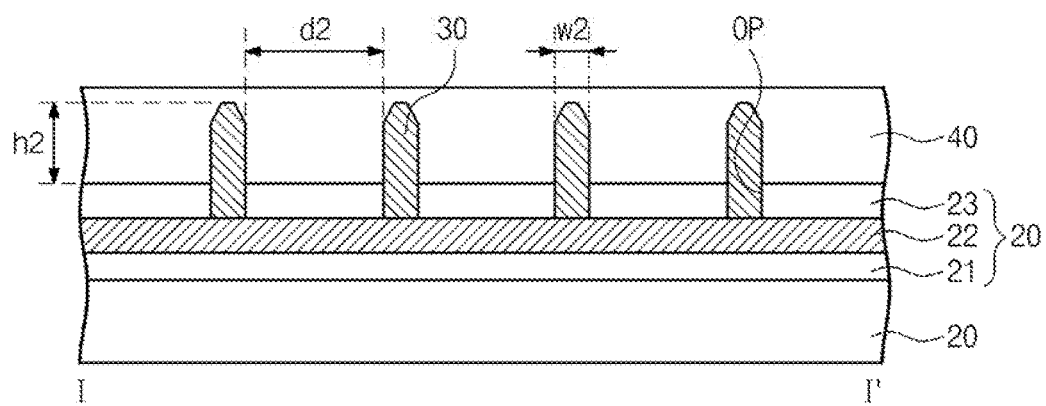
FIG. 3 is a sectional view taken along the line I-I' in FIG. 2.
Figure 4:
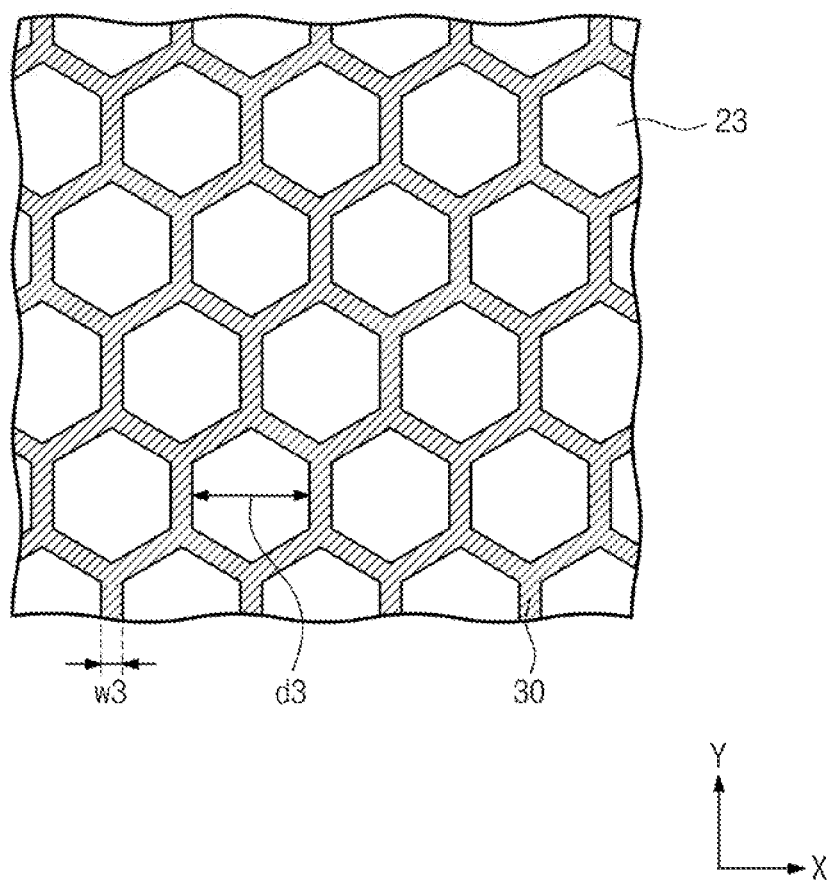
FIG. 4 is a plan view illustrating another example of a metal pattern according to embodiments of the inventive concept.

FIG. 1 is a perspective view illustrating an example of a transparent electrode manufactured according to embodiments of the inventive concept. FIG. 2 is a plan view of FIG. 1. FIG. 3 is a sectional view taken along the line I-I' in FIG. 2. FIG. 4 is a plan view illustrating another example of a metal pattern according to embodiments of the inventive concept. In FIG. 2, a protective layer 40 is not shown.

Referring to FIGS. 1 to 3, a multi-layered transparent conductive film 20 may be disposed on a transparent substrate 10. The multi-layered transparent conductive film 20 may be a hybrid electrode having an oxide/metal/oxide (OMO) structure.

According to an embodiment of the inventive concept, the multi-layered transparent conductive film 20 may include a first oxide layer 21, a metal layer 22, and a second oxide layer 23 which are sequentially laminated. That is, the multi-layered transparent conductive film 20 may include the metal layer 22, and the first oxide layer 21 and the second oxide layer 23 which face each other with the metal layer 22 therebetween. The first oxide layer 21 and the second oxide layer 23 each may include, for example, zinc oxide (ZnO), tin oxide ($SnO_2$), silicon oxide ($SiO_2$), titanium oxide ($TiO_2$), silicon nitride ($SiN_x$), ZITO ($ZnO+In_2O_3+SnO_2$), ZTO ($ZnO+SnO_2$), AZO (Al-doped ZnO), GZO (Ga-doped ZnO), ITO ($In_2O_3+SnO_2$), IZO ($In_2O_3+ZnO$), or a compound thereof. Although the first oxide layer 21 and the second oxide layer 23 may include the same material as each other, embodiments of the inventive concept are not limited thereto. The metal layer 22 may include, for example, a silver (Ag) alloy containing aluminum (Al), molybdenum (Mo), gold (Au), palladium (Pd), titanium (Ti), and copper (Cu), or silver (Ag). The first oxide layer 21 and the second oxide layer 23 may have a thickness larger than the thickness of the metal layer 22. For example, the first oxide layer 21 and the second oxide layer 23 each may have a thickness of 30 to 60 nm, and the metal layer 22 may have a thickness of 5 to 15 nm. When the thickness of the metal layer 22 is larger than the above range, the transmittance of the transparent electrode may be reduced. Furthermore, although the first oxide layer 21 and the second oxide layer 23 may have the same thickness as each other, embodiments of the inventive concept are not limited thereto.

According to the inventive concept, the second oxide layer 23 may have an opening OP exposing the upper surface of the metal layer 22. In the plan view, the opening OP may have a mesh structure. For example, in the plan view, the opening OP may have a grid shape. Specifically, the opening OP may include first openings OP1 which extend in the X-direction to form a plurality of rows, and second openings OP2 which extend in the Y-direction to form a plurality of columns.

In the opening OP, a metal pattern 30 may be disposed. Thus, the metal pattern 30 may have the substantially same planar structure as the opening OP. That is, in the plan view, the metal pattern 30 may have a mesh structure. For example, in the plan view, the metal pattern 30 may have a grid shape. Specifically, the metal pattern 30 may include first metal patterns 31 which extend in the X-direction to form a plurality of rows, and second metal patterns 32 which extend in the Y-direction perpendicular to the X-direction to form a plurality of columns. The first patterns 31 may have a first width w1, and may be spaced apart at a first distance d1 from each other. The first width w1 may correspond to widths of the first openings OP1, and the first distance d1 may correspond to the spacing between the first openings OP1 adjacent to each other. Likewise, the second patterns 32 may have a second width w2, and may be spaced apart at a second distance d2 from each other. The second width w2 may correspond to widths of the second openings OP2, and the second distance d2 may correspond to the spacing between the second openings OP2 adjacent to each other. For example, the first and second widths w1 and w2 each may be 1 to 20 μm. The first and second distances d1 and d2 each may be 1 to 1,000 μm. When the first and second widths w1 and w2 are larger than the above range and the first and second distances d1 and d2 are less than the above range, the transmittance of the transparent electrode may be reduced and optical moire and star burst phenomena may occur. According to an embodiment, the first and second widths w1 and w2 may be equal to each other, and the first and second distances d1 and d2 may be equal to each other. However, embodiments of the inventive concept are not limited thereto.

The metal pattern 30 fills the opening OP, and may protrude over the upper surface of the second oxide layer 23. For example, the metal pattern 30 may protrude to a second height h2 from the upper surface of the second oxide layer 23. For example, the second height h2 may be 0.1 to 10 μm. The metal pattern 30 may include a highly conductive metal. For example, the metal pattern 30 may include copper (Cu), nickel (Ni), silver (Ag), or an alloy thereof.

According to another embodiment, the metal pattern 30 may be implemented in various mesh structures. For example, as illustrated in FIG. 4, the metal pattern 30 may have a honeycomb-shaped mesh structure. Correspondingly, the opening OP of the second oxide layer 23 may also have a honeycomb shape. In this case, the metal pattern 30 may have a third width w3. For example, the third width w3 may be 1 to 20 μm. Parallel metal lines of the metal pattern 30 may be spaced apart at a third distance d3 from each other. For example, the third distance d3 may be 1 to 1,000 μm.

On the metal pattern 30, a protective layer 40 may be disposed. The protective layer 40 may cover the second oxide layer 23 and the metal pattern 30. The upper surface of the protective layer 40 may have a height of 1 to 11 μm from the upper surface of the second oxide layer 23. The protective layer 40 may include silicon oxide ($SiO_2$). The protective layer 40 may be provided to physically protect the metal pattern 30. According to another embodiment, the transparent electrode may not include the protective layer 40 if necessary.

Hereinafter, a method for manufacturing a transparent electrode according to embodiments of the inventive concept will be described with reference to FIGS. 5 to 10.

Figure 5:
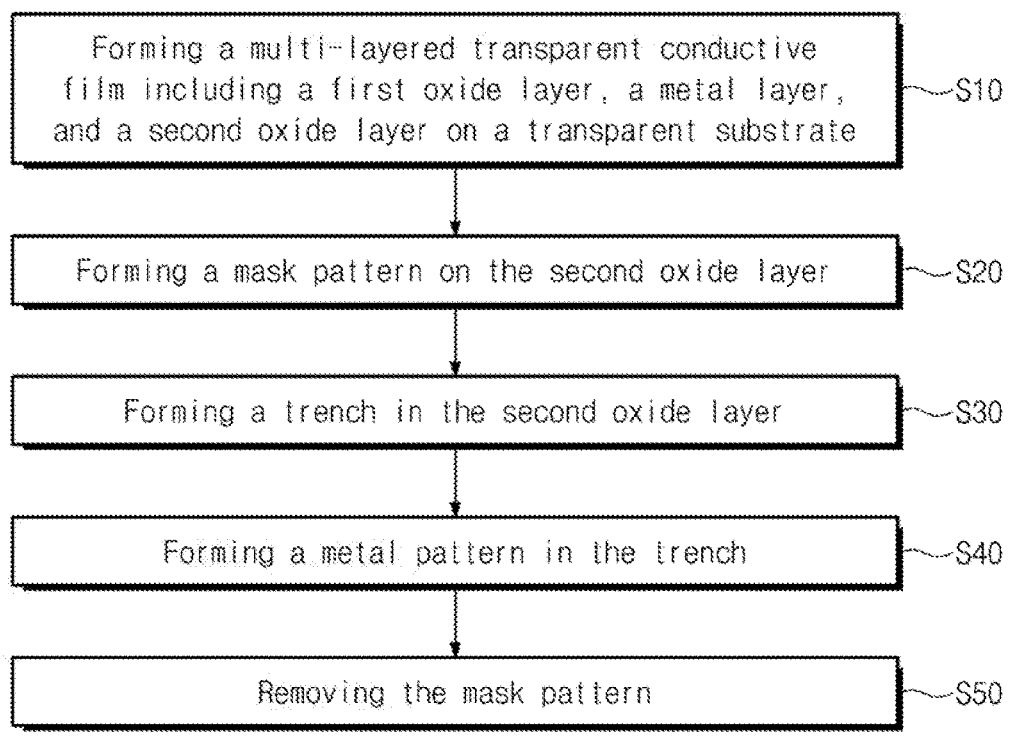
FIG. 5 is a flow diagram illustrating a manufacturing process of the transparent electrode according to embodiments of the inventive concept.

FIG. 5 is a flow diagram illustrating a manufacturing process of the transparent electrode according to embodiments of the inventive concept. FIGS. 6 to 10 are sectional views corresponding to the line I-I' in FIG. 2, and illustrating a manufacturing process of the transparent electrode according to embodiments of the inventive concept.

Figure 6:
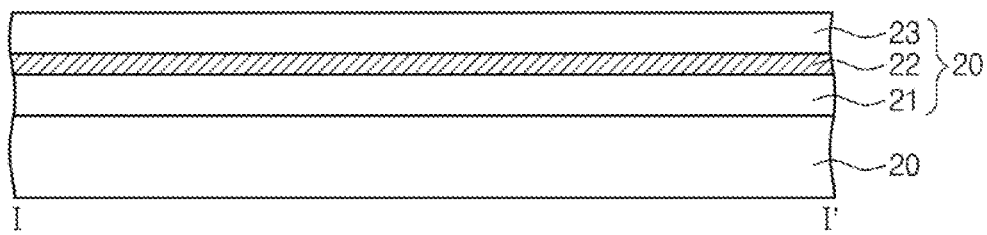
FIGS. 6 to 10 are sectional views corresponding to the line I-I' in FIG. 2, and illustrating a manufacturing process of a transparent electrode according to embodiments of the inventive concept.

Referring to FIGS. 5 and 6, the multi-layered transparent conductive film 20 may be formed on the transparent substrate 10 (S10). The multi-layered transparent conductive film 20 may be a hybrid electrode having an oxide/metal/oxide (OMO) structure. Specifically, the multi-layered transparent conductive film 20 may be formed by sequentially laminating the first oxide layer 21, the metal layer 22, and the second oxide layer 23 on the transparent substrate 10. For example, the first oxide layer 21, the metal layer 22, and the second oxide layer 23 each may be formed by using a physical vapor deposition (PVD) process, a chemical vapor deposition (CVD) process, or a sputtering process.

Figure 7:
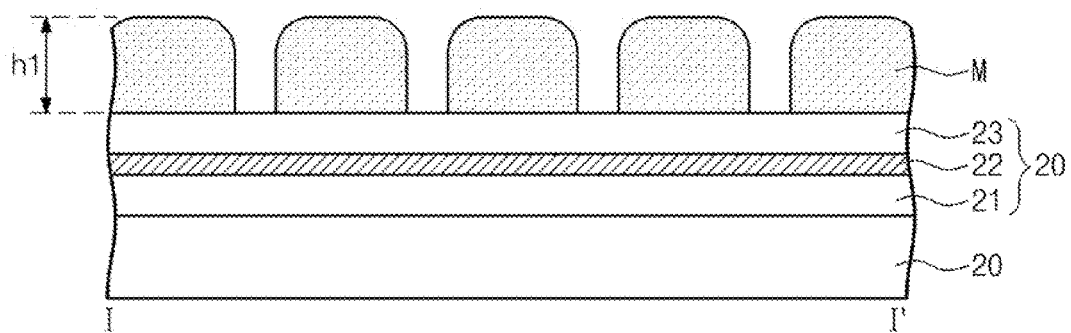

Referring to FIGS. 5 and 7, a mask pattern M may be formed on the second oxide layer 23 (S20). The mask pattern M may be, for example, a photo resist pattern. For example, the mask pattern M may be formed in such a way that photo resist is applied onto the second oxide layer 23, the photo resist is exposed, and the exposed photo resist is developed. In this case, the mask pattern M may be formed so as to have a first height h1 from the upper surface of the second oxide layer 23. The first height h1 may be 1 to 10 μm. The mask pattern M may expose a portion of the upper surface of the second oxide layer 23.

Figure 8:
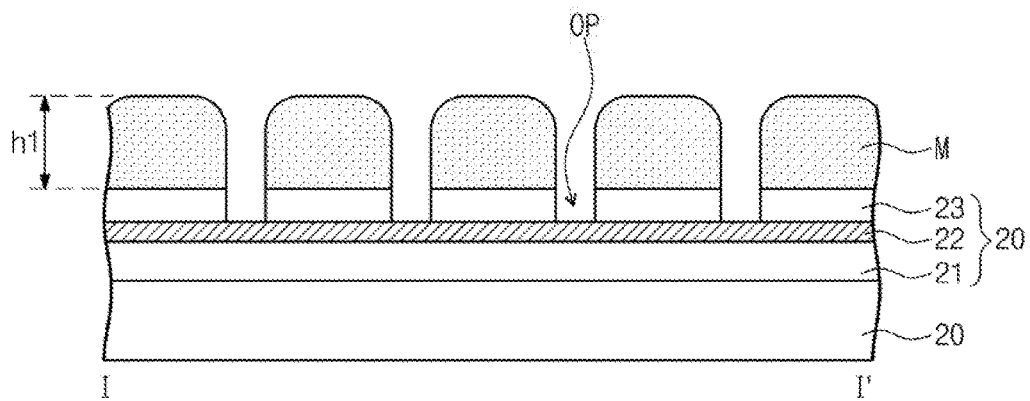

Referring to FIGS. 5 and 8, the opening OP may be formed in the multi-layered transparent conductive film 20 (S30). The opening OP may be formed by etching the second oxide layer 23 by using the mask pattern M as a mask. In this case, the opening OP may expose the upper surface of the metal layer 22. In the plan view, the opening OP may have a mesh structure. As described with reference to FIGS. 1 to 3, the opening OP, for example, may have a grid shape as seen from the plan view. Specifically, the opening OP may include the first openings OP1 which extend in the X-direction to form a plurality of rows, and the second openings OP2 which extend in the Y-direction to form a plurality of columns.

Figure 9:
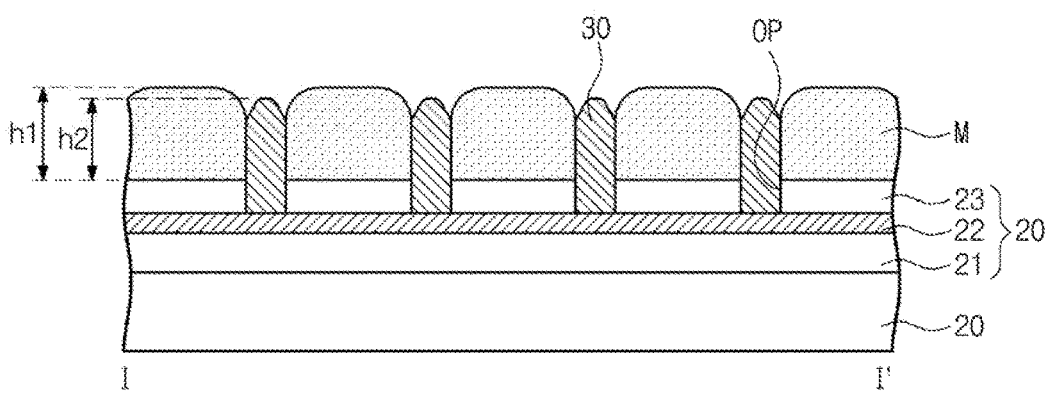

Referring to FIGS. 5 and 9, the metal pattern 30 may be formed in the opening OP (S40). The metal pattern 30 may be formed through a plating process. For example, the plating process may include metal electroless plating or metal electroplating. During the plating of the metal pattern 30, the source material used in the plating process may be deposited only on the exposed upper surface of the metal layer 22, without being deposited on the mask pattern M. For example, in the case of electroless plating, the exposed upper surface of the metal layer 22 may serve as a seed. That is, the exposed upper surface of the metal layer 22 may increase uniformity of the metal pattern 30 to be plated, and serve as an initial nucleation site. For example, in the case of electroplating, metal ions may be deposited to the exposed upper surface of the metal layer 22 by an electric potential applied to the metal layer 22. The source material used in the plating process for forming the metal pattern 30 may include copper (Cu), nickel (Ni), silver (Ag), or an alloy thereof. The metal pattern 30 may be filled from the bottom of the opening OP by the plating process. That is, the opening OP and the mask pattern M may serve as a mold in which the metal pattern 30 is filled. The metal pattern 30 may be formed so as to have the second height h2 from the upper surface of the second oxide layer 23. The second height h2 may be 0.1 to 10 μm. In this case, the second height h2 may be less than the first height h1. That is, the metal pattern 30 may not protrude over the upper surface of the mask pattern M. This is intended to allow the metal pattern 30 to maintain the planar structure defined by the opening OP during the plating of the metal pattern 30. When the metal pattern 30 is plated so as to protrude over the upper surface of the mask pattern M, the metal pattern 30 grows so as to planarly spread out on the mask pattern M.

Since the metal pattern 30 according to embodiments of the inventive concept is formed by filling the opening OP, the metal pattern 30 may have the substantially same planar structure as the opening OP. That is, the planar structure of the metal pattern 30 is determined by the planar structure of the opening OP, which means that the planar structure of the metal pattern 30 may be adjusted through patterning of the mask pattern M, which forms the opening OP. For example, as described with reference to FIGS. 1 to 3, in the case where the opening OP has a grid shape as seen from the plan view, the metal pattern 30 may be formed in a grid shape as seen from a plan view. In this case, the width and distance in the metal pattern 30 may correspond to the width and spacing in the openings OP. According to another embodiment, the metal pattern 30 may various planar structures defined by the opening OP. For example, as described with reference to FIG. 4, the opening OP of the second oxide layer 23 may have a honeycomb-shaped mesh structure, and the metal pattern 30 may also be formed in a honeycomb shape correspondingly.

Figures 10, 11:
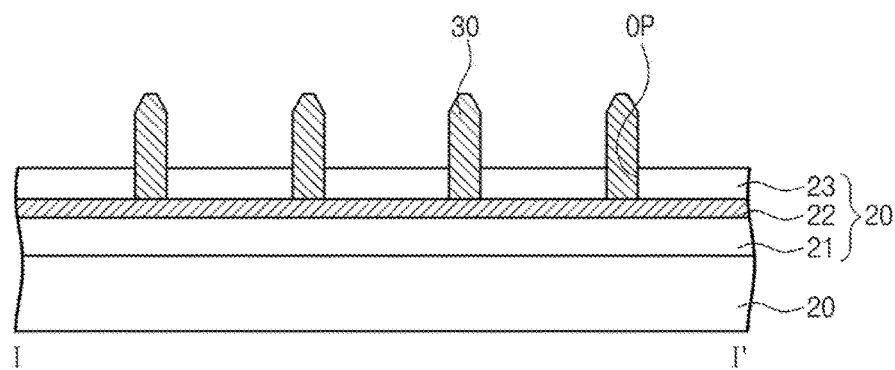
FIG. 11 is a table illustrating simulation results of the transmittance and the sheet resistance of a transparent electrode according to embodiments of the inventive concept.

Referring to FIGS. 5 and 10, the mask pattern M may be removed (S50). For example, the mask pattern M may be removed through an ashing process. By removing the mask pattern M, the upper surface of the second oxide layer 23 may be exposed.

Referring to FIG. 1 again, the protective layer 40 may be formed on the second oxide layer 23 and the metal pattern 30. The protective layer 40 may be formed through a spin on glass (SOG) process, a plasma enhanced chemical vapor deposition (PECVD) process, or the like. In this case, the upper surface of the protective layer 40 may be higher than the upper surface of the metal pattern 30. That is, the protective layer 40 may be formed so as to cover the second oxide layer 23 and the metal pattern 30. The protective layer 40 may include silicon oxide ($SiO_2$). According to another embodiment, the step for forming the protective layer 40 may be omitted if necessary.

The transmittance and the sheet resistance of the transparent electrode according to the width, distance, and height of the metal pattern 30 were simulated. FIG. 11 is a table illustrating simulation results of the transmittance and the sheet resistance of a transparent electrode according to embodiments of the inventive concept.

In this simulation, it is assumed that the transparent substrate 10 is formed of glass and the metal pattern 30 is formed of copper (Cu). In this case, the resistivity of copper (Cu) is $1.724 \cdot 10^{-7}$ Ω·cm. It is also assumed that the first width w1 and the second width w2 of the first metal patterns 31 and the second metal patterns 32 which constitute the metal pattern 30 are equal to each other, and the first distance d1 by which the first metal patterns 31 are spaced apart from each other is equal to the second distance d2 by which the second metal patterns 32 are spaced apart from each other.

Referring to FIG. 11, line width represents the width in the first metal patterns 31 and the second metal patterns 32, pitch represents the spacing in the first and second metal patterns 31 and 32, and thickness represents the second height h2 by which the metal pattern 30 protrudes from the upper surface of the second oxide layer 23. T represents the transmittance of the transparent electrode, and Rs represents the sheet resistance of the transparent electrode. From the simulation results, it can be seen that the transparent electrode has a transmittance of 89 to 91.5% and a sheet resistance of 0.1724 to 1.2792 Ω/□.

In other embodiments, the transparent electrode may further include an adhesion layer between the first oxide layer 21 and the metal layer 22 or between the metal layer 22 and the second oxide layer 23, thereby improving adhesion between the first and second oxide layers 21, 23 and the metal layer 22, thermal stability at high temperature, and plating uniformity during the plating of the metal pattern. Herein, for convenience in description, the following description will be focused on features which are different from the above description or are not described above, and omitted parts are subject to the aforementioned embodiments of the inventive concept.

Figure 12:
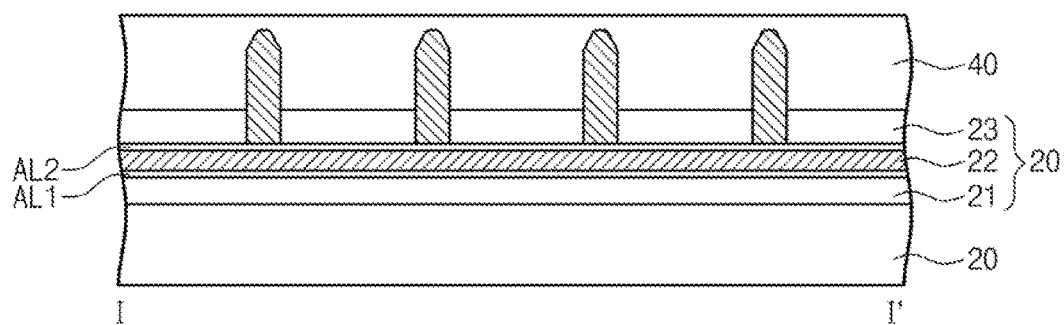
FIG. 12 is a sectional view illustrating an example of modification of a transparent electrode according to embodiments of the inventive concept.

FIG. 12 is a sectional view illustrating an example of modification of a transparent electrode according to embodiments of the inventive concept. Referring to FIG. 12, the first oxide layer 21, the first adhesion layer AL1, the metal layer 22, the second adhesion layer AL2, and the second oxide layer 23 may be sequentially laminated on the transparent substrate 10 to form the multi-layered transparent conductive film 20. For example, the adhesion layer may be laminated together with the first oxide layer 21, the metal layer 22, and the second oxide layer 23 by using a physical vapor deposition (PVD) process, a chemical vapor deposition (CVD) process, or a sputtering process in the process for forming the multi-layered transparent conductive film 20. The first and second adhesion layers AL1 and AL2 may include aluminum (Al), titanium (Ti), chromium (Cr), aluminum nitride (AlN), titanium nitride (TiN), aluminum oxide ($Al_2O_3$), titanium oxide ($TiO_2$), chromium oxide ($Cr_2O_3$), or silicon oxide ($SiO_2$, $Si_3O_4$). The first and second adhesion layers AL1 and AL2 may have a thickness of 0.5 to 10 nm. Although FIG. 11 illustrates a case in which both the first adhesion layer AL1 and the second adhesion layer AL2 are included, the transparent electrode may alternatively include either the first adhesion layer AL1 or the second adhesion layer AL2.

On the second oxide layer 23, the mask pattern M may be formed. The mask pattern M may be, for example, a photo resist pattern. For example, the mask pattern M may be formed in such a way that photo resist is applied onto the second oxide layer 23, the photo resist is exposed, and the exposed photo resist is developed.

Subsequently, the opening OP may be formed in the multi-layered transparent conductive film 20. The opening OP may be formed by etching the second oxide layer 23 by using the mask pattern M as a mask. The opening OP formed in the second oxide layer 23 may expose a portion of the upper surface of the second adhesion layer AL2 rather than the metal layer 22. In the plan view, the opening OP may have a mesh structure.

In the opening OP, the metal pattern 30 may be formed. The metal pattern 30 may be formed through a plating process. The source material used in the plating process may be deposited only on the exposed upper surface of the second adhesion layer AL2. That is, the metal pattern 30 may be formed on the exposed upper surface of the second adhesion layer AL2. In this case, the second adhesion layer AL2 may play the same role as the metal layer 22 in the aforementioned plating process.

The mask pattern M may be removed. For example, the mask pattern M may be removed through an ashing process.

By removing the mask pattern M, the upper surface of the second oxide layer 23 may be exposed.

On the second oxide layer 23 and the metal pattern 30, the protective layer 40 may be formed. The protective layer 40 may be formed through a spin on glass (SOG) process, a plasma enhanced chemical vapor deposition (PECVD) process, or the like. In this case, the protective layer 40 may be formed so as to cover the second oxide layer 23 and the metal pattern 30.

In other embodiments, the method for manufacturing a transparent electrode may further include a step for forming an anti-oxidation film on the metal pattern 30, thereby preventing the oxidation of the metal pattern 30. Herein, for convenience in description, the following description will be focused on features which are different from the above description or are not described above, and omitted parts are subject to the aforementioned embodiments of the inventive concept.

Figure 13:
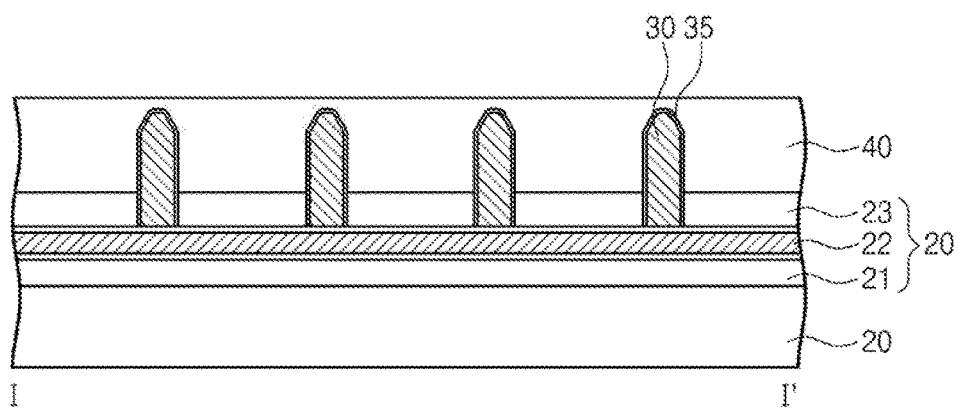
FIG. 13 is a sectional view illustrating another example of modification of a transparent electrode according to embodiments of the inventive concept.

FIG. 13 is a sectional view illustrating another example of modification of a transparent electrode according to embodiments of the inventive concept. Referring to FIG. 13, the multi-layered transparent conductive film 20 may be formed on the transparent substrate 10. The multi-layered transparent conductive film 20 may be formed by sequentially laminating the first oxide layer 21, the metal layer 22, and the second oxide layer 23 on the transparent substrate 10. For example, the first oxide layer 21, the metal layer 22, and the second oxide layer 23 each may be formed by using a physical vapor deposition (PVD) process, a chemical vapor deposition (CVD) process, or a sputtering process.

On the second oxide layer 23, the mask pattern M may be formed. The mask pattern M may be, for example, a photo resist pattern. For example, the mask pattern M may be formed in such a way that photo resist is applied onto the second oxide layer 23, the photo resist is exposed, and the exposed photo resist is developed.

The opening OP may be formed in the multi-layered transparent conductive film 20. The opening OP may be formed by etching the second oxide layer 23 by using the mask pattern M as a mask. In this case, the opening OP may expose the upper surface of the metal layer 22. In the plan view, the opening OP may have a mesh structure.

In the opening OP, the metal pattern 30 may be formed. The metal pattern 30 may be formed through a plating process. For example, the plating process may include metal electroless plating or metal electroplating. During the plating of the metal pattern 30, the source material used in the plating process may be deposited only on the exposed upper surface of the metal layer 22, without being deposited on the mask pattern M.

An anti-oxidation film 35 may be formed on the metal pattern 30. The anti-oxidation film 35 may be formed through a plating process. For example, after the plating process for forming the metal pattern 30, a plating process for forming the anti-oxidation film 35 may be performed consecutively. The anti-oxidation film 35 may be formed so as to cover the metal pattern 30. The anti-oxidation film 35 may include nickel (Ni) or silver (Ag). The process for forming the anti-oxidation film 35 may be performed in the case where the metal pattern 30 is formed of an easily oxidizable metal such as copper (Cu).

On the second oxide layer 23 and the anti-oxidation film 35, the protective layer 40 may be formed. The protective layer 40 may be formed through a spin on glass (SOG) process, a plasma enhanced chemical vapor deposition (PECVD) process, or the like. In this case, the protective layer 40 may be formed so as to cover the second oxide layer 23 and the oxidation protective layer 35.

In an embodiment, it is disclosed that the coating of the anti-oxidation film 35 is performed after the forming of the metal pattern 30. However, the coating of the anti-oxidation film 35 may be performed after removing the mask pattern M.

In conventional methods for forming a mesh-structured metal electrode by using a plating process, a metal seed layer is formed on a substrate, and an electroless plating process is then performed on the metal seed layer. However, the conventional methods have a limitation in reducing the line width of the metal seed layer.

In the method for manufacturing a transparent electrode according to embodiments of the inventive concept, the second oxide layer may be patterned with a very fine line width of a few nanometers due to the characteristics of photolithography, and a metal pattern is formed through a plating process using the resultant exposed metal layer as a seed. Therefore, a metal pattern having a fine line width may be formed according to the pattering of the mask pattern. The mesh-structured metal pattern having a fine line width of a few nanometers is capable of exhibiting excellent transmittance and preventing optical moire and star burst phenomena. Furthermore, by using simple pattering and plating processes, it is easy to manufacture a large-area transparent electrode.

The transparent electrode manufactured through embodiments of the inventive concept is provided with a mesh-structured metal pattern having a fine line width on a multi-layered transparent conductive film having an oxide/metal/oxide (OMO) structure. Therefore, the transparent electrode is capable of ensuring low-resistance characteristics due to the metal pattern and improving resistance uniformity of the metal pattern, while maintaining high transmittance of the multi-layered transparent conductive film.

Figure 14:
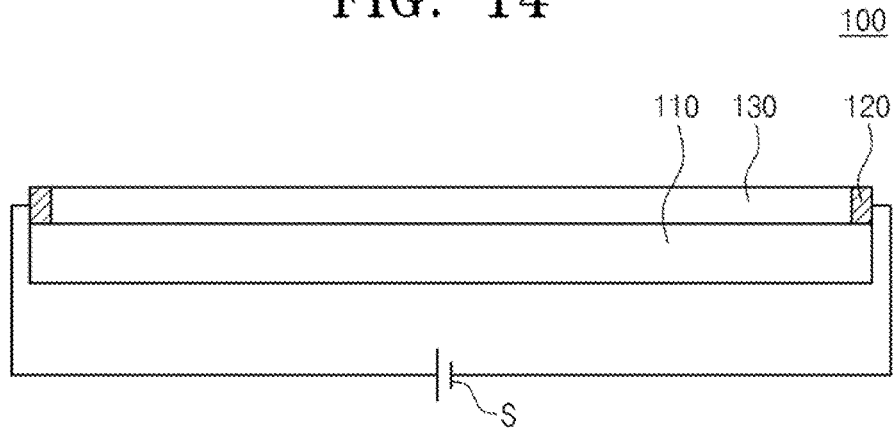
FIG. 14 is a sectional view illustrating an example of a transparent heater to which a transparent electrode according to embodiments of the inventive concept is applied.
Figure 15:
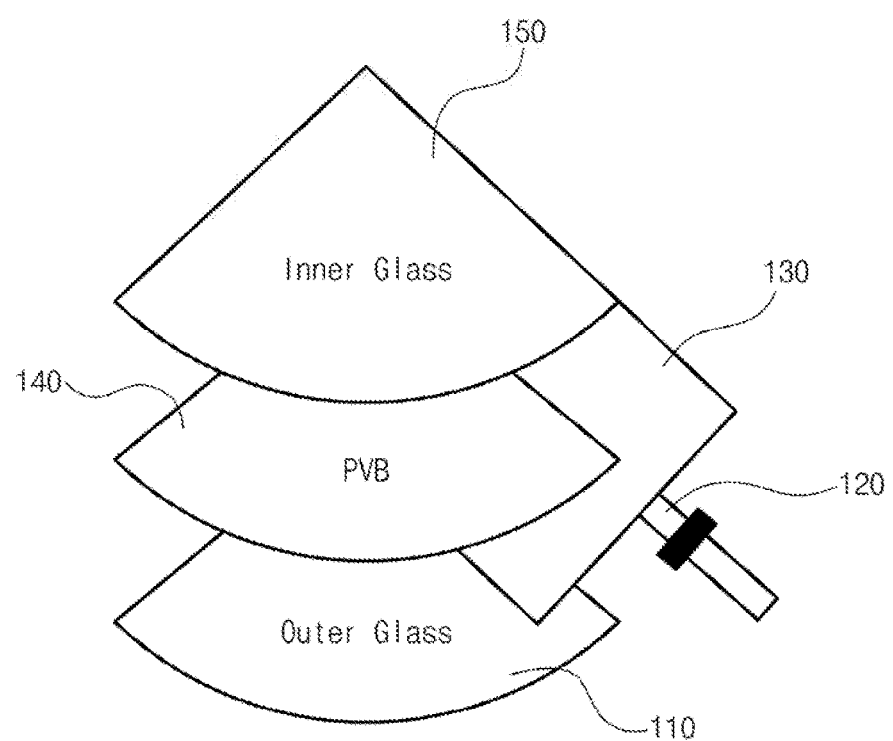
FIG. 15 is an exploded perspective view illustrating an example of laminated glass for automobiles, to which a transparent electrode according to embodiments of the inventive concept is applied.

The above-described transparent electrode may be applied to a transparent heater. The transparent electrode to which the aforementioned features of the present disclosure are applied may be provided as a heating part of the transparent heater. FIG. 14 is a sectional view illustrating an example of a transparent heater to which a transparent electrode according to embodiments of the inventive concept is applied. FIG. 15 is an exploded perspective view illustrating an example of laminated glass for automobiles, to which a transparent electrode according to embodiments of the inventive concept is applied.

Referring to FIG. 14, a transparent heater 100 may include a first transparent substrate 110, electrode terminals 120, and a heating part 130. The heating part 130 may include the transparent electrode according to embodiments of the inventive concept. The heating part 130 may be disposed on the first transparent substrate 110. The electrode terminal 120 may be formed on one side of the first transparent substrate 110, and may be electrically connected to the heating part 130. In this case, the electrode terminals 120 may be electrically connected to an external power source S to supply power to the heating part 130. The heating part 130 may be electrically connected to the electrode terminals 120 and be supplied with power from the external power source S to generate heat according to electric resistance. Referring to FIG. 15, in the case where the transparent heater according to the inventive concept is laminated glass for automobiles, a polyvinyl buryral (PVB) film 140 may be disposed on the heating part 130. The PVB film 140 may be provided to improve stability. A second transparent substrate 150 may be disposed on the PVB film 140. One of the first transparent substrate 110 and the second transparent substrate 150 may be inner glass, and the other may be outer glass.

In the method for manufacturing a transparent electrode according to embodiments of the inventive concept, the second oxide layer may be patterned with a very fine line width of a few nanometers due to the characteristics of photolithography, and a metal pattern is formed through a plating process using the resultant exposed metal layer as a seed. Therefore, the method for manufacturing a transparent electrode according to embodiments of the inventive concept is capable of forming a mesh-structured metal pattern having a fine line width of a few nanometers. Furthermore, by using simple pattering and plating processes, it is easy to manufacture a large-area transparent electrode.

The transparent electrode manufactured through embodiments of the inventive concept is provided with a mesh-structured metal pattern on a multi-layered transparent conductive film. Therefore, the transparent electrode is capable of ensuring low-resistance characteristics due to the metal pattern and improving resistance uniformity of the metal pattern, while maintaining high transmittance of the multi-layered transparent conductive film. Furthermore, the metal pattern having a fine line width is capable of exhibiting excellent transmittance and preventing optical moire and star burst phenomena.

Although embodiments of the inventive concept are described with reference to the accompanying drawings, those skilled in the art will understand that the present invention may be implemented in other specific forms without changing the technical idea or essential features thereof. Therefore, the embodiments described above should be construed as being exemplary in all aspects not for the purpose of limitation.

What is claimed is:

1. A method for manufacturing a transparent electrode, the method comprising:
    forming a multi-layered transparent conductive film on a transparent substrate, the multi-layered transparent conductive film including a first oxide layer, a metal layer, and a second oxide layer which are sequentially laminated on the transparent substrate;
    forming a mask pattern on the second oxide layer;
    performing an etching process using the mask pattern as an etching mask to form a trench in the second oxide layer, the trench exposing the upper surface of the metal layer; and
    forming a metal pattern in the trench.

2. The method of claim 1, wherein the metal pattern has a mesh structure as seen from a plan view.

3. The method of claim 2, wherein the metal pattern has, as seen from a plan view, a grid shape including first metal patterns which extend in one direction to form a plurality of rows, and second metal patterns which extend in the direction perpendicular to the one direction to form a plurality of columns.

4. The method of claim 2, wherein the metal pattern has a honeycomb shape as seen from a plan view.

5. The method of claim 1, wherein the forming of the metal pattern comprises performing a plating process using the exposed upper surface of the metal layer as a seed.

6. The method of claim 5, wherein the plating process uses at least any one selected from the group consisting of copper (Cu), nickel (Ni), silver (Ag), and an alloy thereof as a source material.

7. The method of claim 1, wherein the upper surface of the metal pattern is formed so as to be higher than the upper surface of the second oxide layer and lower than the upper surface of the mask pattern.

8. The method of claim 7, wherein the mask pattern has a height of 1 to 10 μm from one surface of the second oxide layer, and the metal pattern has a height of 0.1 to 10 μm from one surface of the second oxide layer.

9. The method of claim 1, wherein the metal pattern has a width of 1 to 20 μm.

10. The method of claim 1, wherein the metal layer includes any one selected from the group consisting of silver (Ag), aluminum (Al), molybdenum (Mo), gold (Au), palladium (Pd), titanium (Ti), copper (Cu), and an alloy thereof.

11. The method of claim 1, wherein the first oxide layer and the second oxide layer each include any one selected from the group consisting of zinc oxide (ZnO), tin oxide ($SnO_2$), silicon oxide ($SiO_2$), titanium oxide ($TiO_2$), silicon nitride ($SiN_x$), ZITO ($ZnO+In_2O_3+SnO_2$), ZTO ($ZnO+SnO_2$), AZO (Al-doped ZnO), GZO (Ga-doped ZnO), ITO ($In_2O_3+SnO_2$), IZO ($In_2O_3+ZnO$), and a compound thereof.

12. The method of claim 1, wherein the multi-layered transparent conductive film further includes an adhesion layer, and the adhesion layer is formed in at least any one of between the first oxide layer and the metal layer, and between the metal layer and the second oxide layer.

13. The method of claim 12, wherein the adhesion layer includes any one selected from the group consisting of aluminum (Al), titanium (Ti), chromium (Cr), aluminum nitride (AlN), titanium nitride (TiN), aluminum oxide ($Al_2O_3$), titanium oxide ($TiO_2$), chromium oxide ($Cr_2O_3$), and silicon oxide ($SiO_2$, $Si_3O_4$).

14. The method of claim 1, further comprising, after the forming of the metal pattern, forming an anti-oxidation film on the metal pattern.

15. The method of claim 14, wherein the anti-oxidation film includes nickel (Ni) or silver (Ag).

16. The method of claim 1, further comprising forming a protective layer so as to cover the second oxide layer and the meal pattern after removing the mask pattern.

17. The method of claim 16, the protective layer includes silicon oxide ($SiO_2$).

* * * * *